§ United States Patent  
Lomazzi et al.

(10) Patent No.: US 6,981,107 B2
(45) Date of Patent: Dec. 27, 2005

(54) FAST PROGRAMMING METHOD FOR NONVOLATILE MEMORIES, IN PARTICULAR FLASH MEMORIES, AND RELATIVE MEMORY ARCHITECTURE

(75) Inventors: Guido Lomazzi, Castronno (IT); Jacopo Mulatti, Latisana (IT); St fano Surico, Taranto (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 286 days.

(21) Appl. No.: 10/281,078

(22) Filed: Oct. 24, 2002

(65) Prior Publication Data

US 2003/0105941 A1 Jun. 5, 2003

(30) Foreign Application Priority Data

Oct. 25, 2001 (EP) .................................. 01830671

(51) Int. Cl.[7] .............................................. C06F 12/00
(52) U.S. Cl. ...................................... 711/150; 711/154
(58) Field of Search .................... 365/189.04; 710/61, 710/21; 711/150, 154, 156, 219, 215, 102, 711/103

(56) References Cited

U.S. PATENT DOCUMENTS

| 4,580,216 A | * | 4/1986 | Bellay et al. ................. 712/37 |
| 5,369,647 A |   | 11/1994 | Kreifels e tal. ............ 371/25.1 |
| 5,519,847 A |   | 5/1996 | Fandrich et al. ............. 395/496 |
| 5,523,972 A |   | 6/1996 | Rashid et al. ........... 365/185.22 |
| 5,719,808 A |   | 2/1998 | Harari et al. ........... 365/185.33 |
| 6,081,878 A | * | 6/2000 | Estakhri et al. .............. 711/168 |
| 6,131,139 A | * | 10/2000 | Kikuchi et al. .............. 711/103 |
| 6,137,717 A |   | 10/2000 | Sakamoto ............... 365/185.03 |
| 6,202,138 B1 | * | 3/2001 | Estakhri et al. ............. 711/168 |
| 6,397,314 B1 | * | 5/2002 | Estakhri et al. ............. 711/168 |
| 6,418,506 B1 | * | 7/2002 | Pashley et al. ............. 711/103 |
| 6,426,893 B1 | * | 7/2002 | Conley et al. ......... 365/185.11 |

* cited by examiner

Primary Examiner—Mano Padmanabhan
Assistant Examiner—Mardochee Chery
(74) Attorney, Agent, or Firm—Lisa K. Jorgenson; Robert Iannucci; Seed IP Law Group PLLC

(57) ABSTRACT

The programming method includes the following steps: sequentially receiving a plurality of data words; temporarily storing each data word after its reception; and simultaneously writing in parallel the plurality of stored data words in a memory array. After reception and temporary storage of each data word, the memory increments an address counter and sends a "ready" signal. Upon reception of each new data word, the memory verifies whether the address associated thereto is in the same sector as the initial data word and whether n data words have already been stored. If the sector is different, blind-programming step is terminated and the verifying is carried out; if the sector is the same but n data words have already been stored temporarily, the memory writes the temporarily stored words in the memory array, updates the address counter, and then sends the "ready" signal.

17 Claims, 3 Drawing Sheets

FAST PROGRAMMING METHOD FOR NONVOLATILE MEMORIES, IN PARTICULAR FLASH MEMORIES, AND RELATIVE MEMORY ARCHITECTURE

BACKGROUND OF THE INVENTION

1. Field of the Invention

The present invention relates to a method for fast programming nonvolatile memories, in particular flash memories, and to the relative memory architecture.

2. Description of the Related Art

As is known, in flash memories, reading, programming and erasing take place on different time scales: reading a word (formed by a preset number of bits, for example 8, 16, 32) often requires times shorter than 100 ns, programming a word requires times of about 10 $\mu$s, and erasing a sector (meaning thereby the group of memory cells that can be erased only simultaneously) lasts several hundreds of milliseconds (for example, 800 ms for a 512-kilobit sector).

Consequently, in a standard 32-Mb flash memory organized according to words, i.e., a memory wherein a word is the minimum unit on which it is possible to carry out reading and programming operations, programming of the entire memory array takes almost 20 sec., and erasure of all the sectors approximately 50 sec.

The last few years have witnessed a considerable market growth as regards many flash-memory applications; as a result, some customers require large quantities of these devices, even of the order of several million per year. Consequently, in-factory programming of such a large number of memories becomes ever more important for the customers, who thus demand flash memories that may be programmed in shorter times than current ones.

Standard programming of a single word currently takes place in three steps: sending a programming command; proper programming (during which the cells that make up the word to be programmed receive a high-voltage programming pulse); and verifying that programming has been successful.

Proper programming is the most burdensome in terms of time, in so far as the other steps (respectively represented by a cycle operation on the pins and a reading operation) may last less than 1 $\mu$s.

Proper programming requires the generation of high voltages. This may take place either internally (single-supply flash memories) or externally (double-supply flash memories). In the second case, which will be considered hereinafter, the memory is able to generate the programming voltage in very short times starting from a voltage supplied from outside and far higher than standard voltage supply (up to 12 V). In addition, the memory is able to parallel program all the cells that store each word (hereinafter also referred to collectively as a memory location). In this case, moreover, the memory is also able to carry out parallel programming of more than one word, even though the latter mode would entail considerably high circuit complication (and hence large overall dimensions), since the memory should include special registers for addresses and patterns of the words to be stored (meaning by patterns of the words the sequences of bits of each word).

In order to reduce the programming time, various programming modes have been developed.

For example, certain memories enable abbreviated modes of command writing (commonly referred to as "Unlock Bypass Mode").

In addition, flash memories are available on the market that are provided with a programming mode, referred to as "Factory Program", purposely designed for mass production, where for each memory device even millions of memory locations have to be programmed in the factory.

According to this programming mode, the memory locations are written in sequence in successive addresses using a double supply voltage. For this purpose, first blind programming pulses are sent to the locations to be written and, at the end of the blind writing, sequential verification is carried out on all the locations written. During verify, the user must repeat, for each address, the programmed pattern of each location and, only if verify of a individual location fails, a standard programming of the location is carried out.

In detail, according to the "factory program" mode, the user initially supplies a command for activating the programming step; issues a command for executing a chip-enable (CE#) cycle which defines the initial address and the pattern that is to be programmed at this address; the pattern is written in the memory, and execution of the operation is confirmed by a "ready" signal; upon reception of the "ready" signal, the user carries out a subsequent CE# cycle, providing the new pattern to be programmed in the next position. In order to terminate the blind-programming step, the user must supply the address of a sector different from the initial one; this sending is then interpreted by the memory as end of programming and start of the verify step. In other words, once the initial address has been defined, by means of a successive CE# cycle the user supplies, to the memory, patterns that are written in subsequent addresses. The address increment thus takes place within the memory.

Verify follows the same logic.

In this way, the internal voltages necessary for programming and verifying are generated only once for the entire sequence of words to be programmed and verified, instead of for each word to be written.

An important advantage of the "factory program" mode lies in the fact that the type of interface used, wherein the address of the locations to be programmed is calculated within the memory and does not have be supplied by the programmer, is particularly suited to the majority of the programming devices currently available on the market, thus enabling the time of handshake between the user and the memory to be considerably reduced.

Consequently, the "factory program" mode is undoubtedly so far the one affording the best performance in flash memories. Standard programming requires in fact 8 $\mu$s/word; with the Unlock Bypass mode and double supply voltage the time reaches 5 $\mu$s/word, and with the "factory program" mode it drops to as few as 3.5 $\mu$s/word.

Nevertheless, the market demands ever faster memories, and consequently the problem arises of how to reduce the programming times further.

BRIEF SUMMARY OF THE INVENTION

An embodiment of the present invention provides a programming method and an architecture that will enable speeding-up of programming even further.

BRIEF DESCRIPTION OF THE SEVERAL VIEWS OF THE DRAWINGS

For a better understanding of the present invention, a preferred embodiment thereof is now described, purely by way of non-limiting example, with reference to the attached drawings, wherein.

DETAILED DESCRIPTION OF THE INVENTION

According to an embodiment of the present invention, in order to reduce the programming time as compared to the "factory program" mode, an adjustment is made when supplying the programming pulse, and more than one memory location is written each time.

From this point of view, however, what constitutes the strong point of the current "factory program" also represents its limitation, in so far as its interface between the flash memory and the user, which is based upon individual CE# cycles in which the patterns to be programmed are provided, minimizes the times involved in the memory/user handshake, but in practice ties the user down to just one programming for each individual memory location. In order to program n memory locations in parallel, it would be necessary to abandon this interface; in fact the user would be forced to know how many locations are programmed in parallel, supply the memory with n−1 CE# cycles with the patterns to be programmed without verifying, and, only after supplying the n-th cycle, wait for the time necessary for programming. The aforesaid interface then requires from the user the capacity to count the number of cycles provided and to increment the addresses, in so far as he must always supply a number of patterns equal to the number of locations programmed in parallel, and subsequently must furnish the address of the (n+1)-th location, together with the corresponding pattern.

The above procedure, however, would increase the handshake time between user and memory and would further call for burdensome modifications to be made in the hardware of the programmer in order to enable the latter to make the address increments.

In order to solve the above problem, with the present programming method, hereinafter defined as "multiple word programming", the user initially supplies the programming command, with the initial address and the pattern to be programmed. Upon receiving these data, the memory stores the initial address and the corresponding pattern, for instance in a special register, and supplies the user with the "ready" signal; then the user supplies in sequence further patterns to be written in successive locations. The memory temporarily stores these patterns and updates the addresses (for example, by incrementing a counter), and supplies the "ready" signal until it receives the n-th programming cycle. At this point, the memory carries out programming and only at the end supplies the "ready" signal.

An implementation of the present method will now be described with reference to FIGS. 1 and 2, which show flowcharts of the operations respectively carried out by the user and by the memory.

Figure 1:
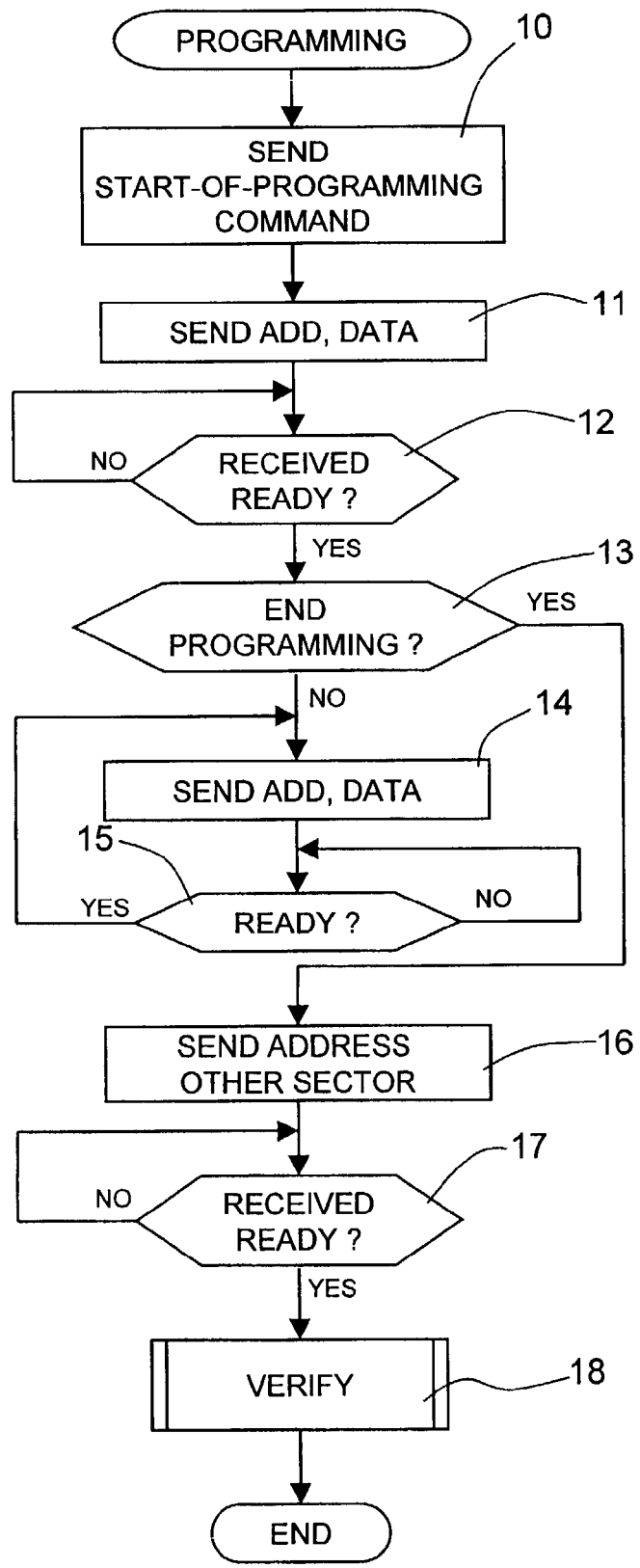
FIGS. 1 and 2 are flowcharts of a programming method according to an embodiment of the invention.

As shown in FIG. 1, when the user is to program the memory, he initially sends to the memory a command, or series of commands, which signals start of programming—step 10.

Next—step 11—the user supplies the initial address ADD together with the corresponding word DATA that is to be written.

Then—step 12—the user sets himself in a wait state for the READY signal from the memory, which is issued immediately, as will be clarified hereinafter.

Upon reception of the READY signal, the user verifies whether he has already sent all the words that are to be programmed—step 13—and, if the answer is "NO", activates a CE# cycle, sending the new word DATA to be written and an address of the same sector, for example the same initial address or some other random address—step 14. Sending the address in this step is not, however, indispensable. Next, the user sets himself in a wait state for the READY signal from the memory—step 15—and then sends in sequence the words to be written via successive CE# cycles, returning to step 14.

After sending all the words to be programmed (output "YES" from the end-of-programming verifying step 13), the user sends the address of a different sector—step 16—and sets himself in a wait state for the READY signal—step 17. Upon receiving this signal (after a certain period of time due to programming of the last group of locations, as described later), the user issues a command for the verify step—routine 18—in a way similar to the "factory program" mode and hence not described in detail herein.

Figure 2:
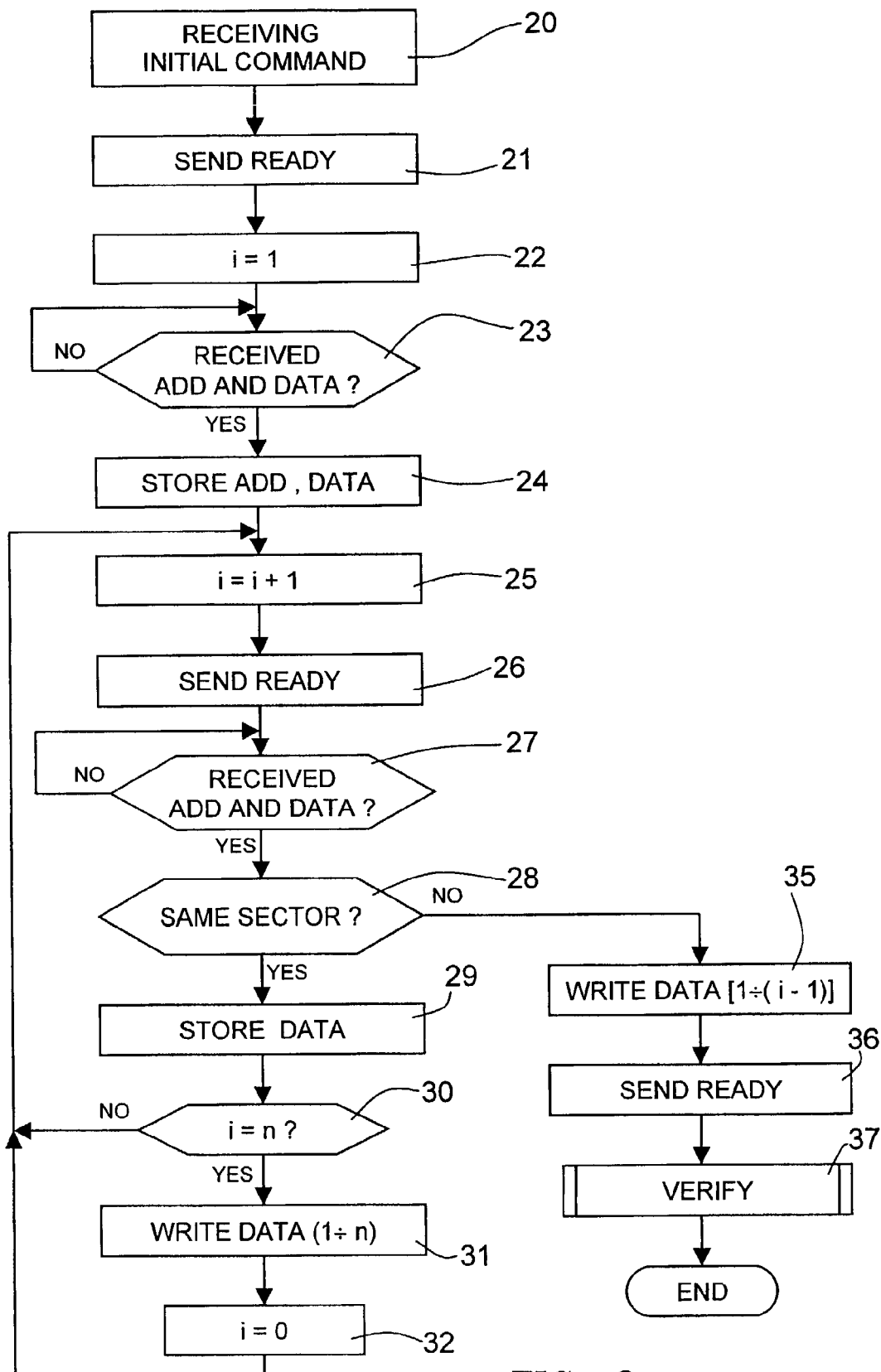

As shown in FIG. 2, as soon as the memory receives the command, or series of commands, signaling start of programming—step 20—it sends the READY signal—step 21. Then it initializes a word counter i—step 22—and sets itself in a wait state for the initial address ADD and for the corresponding word DATA to be written—step 23.

As soon as the memory receives this information, it stores it in special registers—step 24—, increments the counter i—step 25—, and immediately sends the READY signal—step 26—without carrying out programming. Then it sets itself in a wait state for the new CE# cycle with the new word DATA and the possible address ADD—step 27.

As soon as the memory receives the above information, it verifies whether the address belongs to the same initial sector—step 28. If the answer is affirmative, the memory writes the new word DATA in a new register—step 29. Next, the memory verifies whether the counter i is equal to the maximum number of words to be parallel programmed—step 30. If not—output NO from step 30—the memory returns to the counter-increment step 25 and repeats the operations described above—steps 26–30—sending READY signals immediately after reception and temporary storage of the words received.

As soon as the memory receives n words and stores each of them in an own register—output YES from block 30—it carries out parallel programming of n locations, using the high voltage available—step 31—, resets the counter i—step 32—, and returns to the counter-increment step 25. After sending the READY signal—step 26—the memory repeats the temporary storage of the patterns received in the n registers, always sending immediately the READY signal, and proceeds cyclically in the way described above for steps 28–32, until it receives an address ADD of a sector other than the initial one, which, as has been said, has the function of indicating end of programming.

In this case—output NO from block 28—the memory writes the envisaged locations with the last words received and temporarily stored in the registers 1 . . . (i−1)—block 35. Then the memory sends the READY signal—block 36. Upon receiving the verify signal—routine 37—the memory verifies the data written in a way similar to the "factory program" mode. In particular, verifying is not carried out in parallel in one embodiment both because the duration of this operation is much shorter than the programming operation, and because the circuitry necessary for reading n words in parallel would entail a considerable occupation of area. Of course, the parallel programming method of FIGS. 1–2 could be employed in conjunction with a parallel verifying operation without departing from the invention.

An example of a storage architecture that enables programming according to the "multiple word programming" mode described above is illustrated in FIG. 3.

Figure 3:
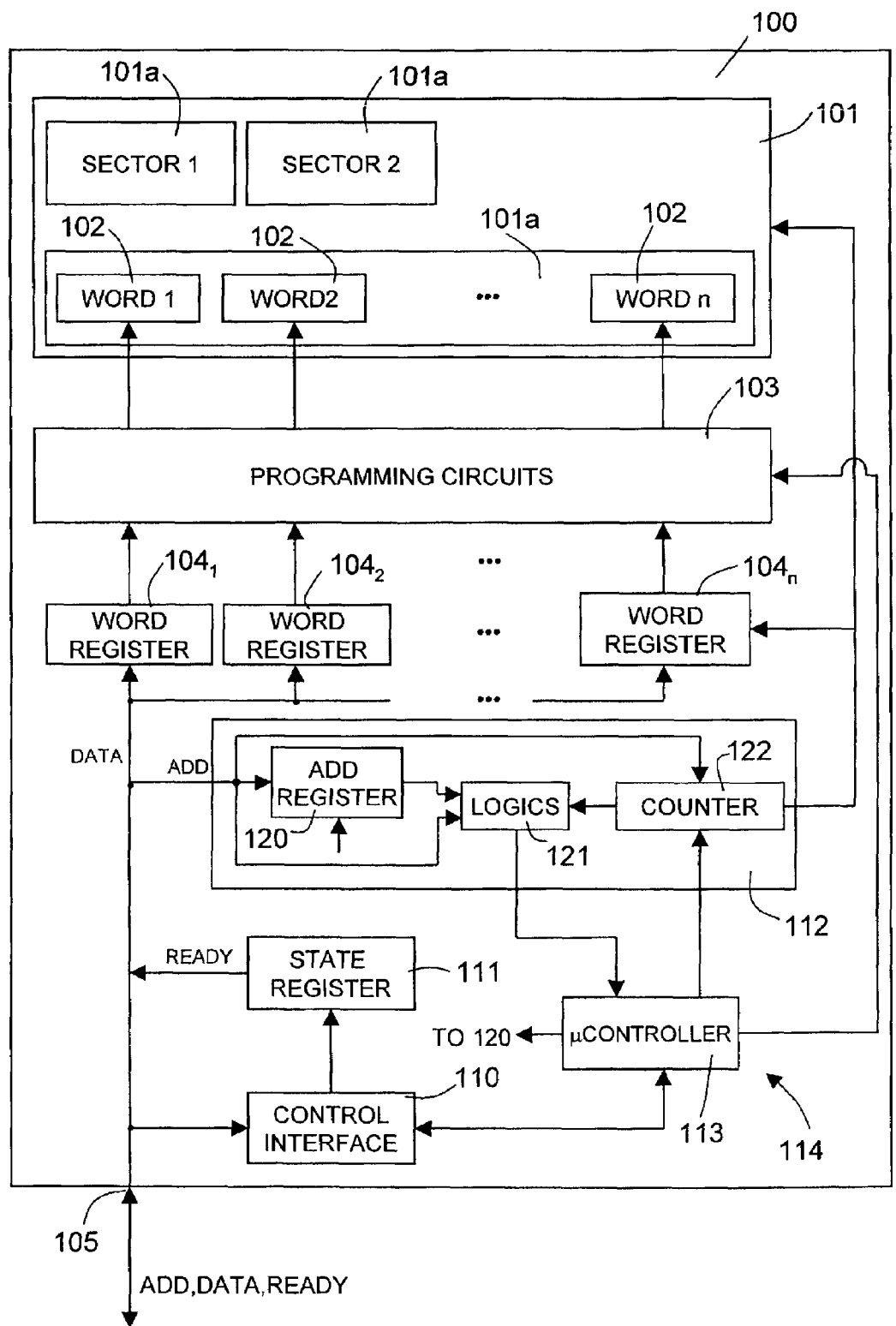
FIG. 3 is a block diagram of a memory device according to an embodiment of the invention.

In detail, FIG. 3 is a simplified representation of a memory device 100, as regards the parts involved in the "multiple word programming" mode. The memory device comprises a memory array 101, for example of the flash type, made up of a plurality of sectors 101a, each of which comprises a plurality of groups of memory cells, each group defining a memory location 102 which is designed to store one word. In a per se known manner, the memory array 101 is connected to programming circuits 103, which are in turn connected, via decoding units (not shown), to n word registers $104_1$, $104_2$, . . . , $104_n$. For example, four word registers $104_i$ may be provided for programming four words in parallel.

The word registers $104_i$ are directly connected to an input/output port 105 on which the memory receives, among other things, the addresses ADD and the patterns DATA and sends to the user (not shown) the READY signal. In any case, the word registers $104_i$ only receive the words DATA.

The memory device 100 further comprises a control interface 110, a state register 111, an address-management unit 112, and a microcontroller 113, which together form a programming-management unit 114.

In detail, the control interface 110 is connected to the input/output port 105 so as to detect the CE# cycles, to the microcontroller 113 for exchanging the control signals, and to the state register 111, to which it sends control signals.

The state register 111 is connected to the input/output port 105 and supplies thereto the READY signal when enabled by the control interface 110. Finally, the address-management unit 112 is connected to the input/output port 105, from which it receives the addresses ADD, to the microcontroller 113, for exchange of operating signals, and to the word registers $104_i$, for sending the storage-enable signals.

The address-management unit 112 comprises an address register 120, a logic 121, and a counter 122, all connected to the input/output port 105 to receive the addresses ADD, as explained in what follows. The address register 120 and the counter 122 moreover each have an input connected to the microcontroller 113 and an output connected to the logic 121. Finally, the logic 121 is connected to the microcontroller 113.

As described hereinafter in detail, the address register 120 stores the initial address ADD sent at start of programming. The counter 122, initially loaded with the initial address, calculates, at each CE# cycle, the current address, incrementing each time its own contents. Finally, the logic 121 compares the initial address, supplied by the address register 120, with the address transmitted by the user and available on the input/output port 105, in order to detect the possible end of programming. In addition, it compares the initial address with the current address, supplied by the counter 122, to detect whether n patterns (word registers 104 already charged with n words) have already been received.

Preferably, the address register 120 only stores, among the bits that make up an address, the ones regarding the sector, and the logic 121 compares them with the corresponding bits of the address ADD transmitted by the user. In addition, the logic 121 receives from the counter only the least significant bits of the current address, calculated by the counter 122 and corresponding to the word registers $104_i$ which should be addressed, and compares them with the end-of-count pattern. For example, if four word registers $104_i$ are present, the end-of-count verify is carried out only on the last two bits, which are used also for enabling the word registers $104_i$.

Operation of the memory device 100 as regards the "multiple word programming" mode is described hereinafter.

When the control interface 110 detects the start-of-programming command, it activates the microcontroller 113, which confirms activation to the control interface 110; consequently, the latter enables the state register 111 to send the READY signal.

Upon detection of the first CE#cycle, the control interface 110 again activates the microcontroller 113, which enables the address register 120 and the counter 122, so as to enable both of them to load the first address ADD. The counter 122, in turn, enables the first word register $104_i$, which stores the first pattern DATA. Then the microcontroller 113 issues a command for incrementing the counter 122, and, via the interface 110, authorizes sending the READY signal.

Upon reception of the next CE#cycle, the microcontroller 113, activated by the control interface 110, verifies the output of the logic 121 to determine whether the end-of-programming signal has been sent. If the answer is negative, via the counter 122 it enables the next word register $104_i$ to store the word DATA. Next, the microcontroller 113 verifies, via the logic 121, whether all the n words have been stored. If the answer is NO, it issues a command for increment of the counter 122 and enables sending of the READY signal, while awaiting a new CE#cycle. If the answer is YES, it activates the programming circuits for programming n locations with the patterns stored in the word registers $104_i$. Only after programming the n words, the microcontroller 113 increments the counter 122 and enables sending of the READY signal.

As already indicated with reference to the flowchart of FIG. 2, when the output of the logic 121 indicates end-of-programming (end of the step of sending blind programming pulses), the microcontroller 113 issues a command for writing the word registers $104_i$, which up to that point have been loaded with the words, and proceeds to the verify, under control of the user.

The advantages of the method and memory described are the following. First, from the user's point of view, the procedure is identical to that of the "factory program" mode and does not require any modifications to the hardware or software; consequently, it can be implemented in all cases where the "factory program" mode according the prior art could be applied. In addition, it is possible to maintain the wholly sequential programming interface of the known "factory program" mode, and hence to maintain the advantages of the latter in terms of reduction of the time for setting the high internal voltages and in terms of duration of handshake between device and user.

From the standpoint of the memory, the architectural modifications are limited to the provision of n word registers, which entail a negligible increment in the overall dimensions, against a considerable reduction in the programming times. In fact, with the "multiple programming mode" it is possible to achieve a speed of 2 $\mu$s/word as compared to the speed of 3.5 $\mu$s/word which can be obtained with the conventional "factory program" mode. The method thus yields a total reduction in the programming times of approximately 45%.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

Finally, it is clear that numerous modifications and variations may be made to the method and memory described and illustrated herein, all falling within the scope of the invention, as defined in the attached claims.

We claim:

1. A nonvolatile memory device comprising:
an input/output port sequentially receiving information comprising data words;
a memory array connected to said input/output port for storing said data words;
a programming-management unit connected to said input/output port for receiving said information, said programming-management unit being connected to and controlling said memory array; and
a plurality of temporary storage elements connected between said input/output port and said memory array and controlled by said programming-management unit, said temporary storage elements temporarily storing a plurality of data words and transferring in parallel and simultaneously said stored data words to said memory array, wherein said information also comprises addresses associated with storage locations in the memory array for storing the data words, and said programming-management unit comprises:
an address register that stores an initial address of the addresses received by the programming-management unit; and
a logic unit having a first input coupled to the input/output port and a second input coupled to an output of the address register, the logic unit being structured to compare the initial address stored in the address register with a current address of the address received by the programming-management unit, determine whether the current address corresponds to a storage location in a same sector of the memory array as the storage location to which the initial address corresponds, and the data words in the temporary storage elements to be transferred in parallel to the memory array in response to determining that the storage location to which the current address corresponds is located in a different sector than the sector in which is located the storage location corresponding to the initial address.

2. The memory device according to claim 1, wherein said temporary storage elements are word registers.

3. The memory device according to claim 1, wherein said plurality of temporary storage elements is equal to n and said programming-management unit comprises a processing unit; said address-management unit being connected to said input/output port, to said plurality of temporary storage elements and to said processing unit, for receiving said addresses, sequentially enabling said temporary storage elements upon reception of the data words, and signaling to said processing unit the temporary storage of a number of data words equal to n.

4. The memory device according to claim 3, wherein said address-management unit comprises a counting unit having a first input connected to said input/output port and receiving the initial address, a second input receiving a count-increment command, and an output supplying the current address; said logic unit having an input connected to said counting unit and an output connected to said processing unit and supplying a signal indicating end of temporary loading of data words in said temporary storage elements.

5. The memory device according to claim 3, wherein said processing unit is a microcontroller.

6. The memory device according to claim 3, wherein said processing unit is connected to said input/output port via a control interface and a state register; said control interface sending a signal indicating reception of information to said processing unit.

7. The memory device according to claim 1, wherein the programming-management unit includes a counting unit having an output coupled to a third input of the logic unit, the counting unit being structured to count how many data words are received for storage in the memory array; and the logic unit is structured to determine from the counting unit whether n data words are simultaneously stored in the temporary storage elements and cause the data words on the temporary storage elements to be transferred in parallel to the memory array in response to determining that n data words are simultaneously stored in the temporary storage elements.

8. A method for programming a nonvolatile memory device including a memory array, in turn including a plurality of sectors, and an address register, the method comprising the following steps:
receiving and temporarily storing a plurality of data words;
receiving and storing an initial address for an initial one of the data words, the initial address corresponding to a storage location in a first sector in the plurality of sectors;
receiving a current address for a current data word received subsequently to the plurality of data words;
determining whether the current address corresponds to a storage location in the first sector; and
simultaneously writing said plurality of data words in the first sector of said memory array in response to determining that the current address does not correspond to a storage location in the first sector.

9. The method according to claim 8, wherein said steps of receiving and storing and simultaneously writing are cyclically repeated plural times.

10. The method according to claim 8, comprising the steps of:
receiving a programming command;
storing said initial address in an address register;
counting how many of the data words are directed to storage locations in the first sector to obtain a count value;
verifying whether said count value is equal to a threshold value; and
simultaneously writing said plurality of data words in response to verifying that said count value equals the threshold value.

11. The method according to claim 8, wherein said steps of receiving and temporarily storing comprise, in sequence:
receiving a data word;
temporarily storing said data word; and
generating a "ready" signal.

12. The method according to claim 8, wherein, if the current address belongs to the first sector, temporarily storing the current data word, and subsequently writing the current data word to the first sector simultaneously with the writing of the plurality of data words in the first sector, in response to determining that a subsequent address of a subsequent data word does not belong to the first sector.

13. A nonvolatile memory device, comprising:
a memory array;
temporary storage means for receiving and temporarily storing a plurality of data words; and
programming means for simultaneously writing the plurality of data words in the memory array, wherein the programming means includes:

means for receiving addresses corresponding to the data words and to memory locations in a first sector of the memory array;

means for storing an initial one of the addresses;

means for determining whether a current address, for a current data word received subsequently to the plurality of data words, corresponds to a memory location in the first sector; and means for simultaneously writing said plurality of data words in the first sector of said memory array in response to determining that the current address does not correspond to a memory location in the first sector.

14. The device according to claim 13, wherein the temporary storage means includes a plurality of word registers, one for each of the data words being written simultaneously to the memory array.

15. The memory device according to claim 14, wherein the programming means includes:

means for sequentially enabling the word registers upon reception of a data word; and means for recognizing that the word registers are full of data words and, in response, causing the data words in the word registers to be written simultaneously to memory locations of the memory array identified by the address corresponding to the data words.

16. The memory device according to claim 13, wherein the programming means includes:

counting means for receiving an initial address and a count-increment command, and supplying a current address; and logic means for receiving the current address and supplying a signal indicating end of temporary loading of data words in the temporary storage means.

17. The memory device according to claim 13, wherein the means for receiving include a input/output port for receiving the data words and corresponding addresses and the programming means includes:

a state register coupled to the input/output port and structured to supply to the input/output port a ready signal;

a control interface coupled to the input/output port and state register and structured to output a signal indicating reception of information; and a processing unit connected to the input/output port via the control interface, the processing unit being structured to activate the means for determining in response to receiving the signal from the control interface.

* * * * *

UNITED STATES PATENT AND TRADEMARK OFFICE
CERTIFICATE OF CORRECTION

PATENT NO. : 6,981,107 B2  
DATED : December 27, 2002  
INVENTOR(S) : Guido Lomazzi et al.

Page 1 of 1

It is certified that error appears in the above-identified patent and that said Letters Patent is hereby corrected as shown below:

<u>Title page,</u>
Item [75], Inventors, third listed inventor should read -- Stefano Surico --.

<u>Column 7,</u>
Line 32, "the address received" should read -- the addresses received --.
Line 37, "and the data words" should read -- and cause the data words --.

<u>Column 8,</u>
Lines 11 and 12, "on the temporary storage element" should read -- in the temporary storage element --.

<u>Column 9,</u>
Line 25, "address" should read -- addresses --.

<u>Column 10,</u>
Line 3, "receiving an initial address" should read -- receiving the initial address --.

Signed and Sealed this

Twenty-fifth Day of April, 2006

JON W. DUDAS
*Director of the United States Patent and Trademark Office*

UNITED STATES PATENT AND TRADEMARK OFFICE
CERTIFICATE OF CORRECTION

PATENT NO. : 6,981,107 B2
DATED : December 27, 2005
INVENTOR(S) : Guido Lomazzi et al.

It is certified that error appears in the above-identified patent and that said Letters Patent is hereby corrected as shown below:

<u>Title page,</u>
Item [75], Inventors, third listed inventor should read -- Stefano Surico --.

<u>Column 7,</u>
Line 32, "the address received" should read -- the addresses received --.
Line 37, "and the data words" should read -- and cause the data words --.

<u>Column 8,</u>
Lines 11 and 12, "on the temporary storage element" should read -- in the temporary storage element --.

<u>Column 9,</u>
Line 25, "address" should read -- addresses --.

<u>Column 10,</u>
Line 3, "receiving an initial address" should read -- receiving the initial address --.

This certificate supersedes Certificate of Correction issued April 25, 2006.

Signed and Sealed this

Twenty-third Day of May, 2006

JON W. DUDAS
*Director of the United States Patent and Trademark Office*